United States Patent
Chen et al.

(10) Patent No.: US 8,710,923 B2
(45) Date of Patent: Apr. 29, 2014

(54) METHOD AND APPARATUS FOR CONTROLLING PEAK AMPLIFIER AND DOHERTY POWER AMPLIFIER

(75) Inventors: Huazhang Chen, Shenzhen (CN); Jianli Liu, Shenzhen (CN); Jinyuan An, Shenzhen (CN); Xiaojun Cui, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 69 days.

(21) Appl. No.: 13/513,272

(22) PCT Filed: Oct. 27, 2011

(86) PCT No.: PCT/CN2011/081392
§ 371 (c)(1),
(2), (4) Date: Jun. 1, 2012

(87) PCT Pub. No.: WO2012/146005
PCT Pub. Date: Nov. 1, 2012

(65) Prior Publication Data
US 2013/0127527 A1    May 23, 2013

(30) Foreign Application Priority Data
Apr. 29, 2011    (CN) .......................... 2011 1 0110315

(51) Int. Cl.
*H03F 1/14*    (2006.01)
(52) U.S. Cl.
USPC ........................................... 330/51; 330/295

(58) Field of Classification Search
USPC ................... 330/51, 53, 84, 124 R, 286, 295
See application file for complete search history.

(56) References Cited

U.S. PATENT DOCUMENTS

| | | | |
|---|---|---|---|
| 6,674,323 B2 * | 1/2004 | Kagaya et al. | 330/51 |
| 6,865,399 B2 * | 3/2005 | Fujioka et al. | 455/553.1 |
| 7,498,878 B2 * | 3/2009 | Lim | 330/124 R |
| 7,928,799 B2 * | 4/2011 | Kusunoki | 330/51 |
| 2004/0263246 A1 | 12/2004 | Robinson et al. | |

FOREIGN PATENT DOCUMENTS

| | | |
|---|---|---|
| CN | 102185571 A | 9/2011 |
| JP | 2009260472 A | 11/2009 |

* cited by examiner

*Primary Examiner* — Khanh V Nguyen
(74) *Attorney, Agent, or Firm* — Brooks Kushman P.C.

(57) ABSTRACT

A control method and apparatus of a peak amplifier of a Doherty power amplifier are disclosed, wherein, the control apparatus includes a Radio Frequency (RF) switching circuit in a peak amplification branch of the Doherty power amplifier, which is used to control the turn-on and turn-off of the peak amplifier in the peak amplification branch. The method and apparatus avoid a disadvantage that the peak branch in the Doherty power amplifier is turned on ahead of time, thus reducing the power consumption of the peak power amplifier, and enhancing the mass efficiency of the whole power amplifier; and largely reducing the product expense and production expense of the power amplifier compared to the scheme of some manufacturers improving on-time of the peak power amplifier using complex digital circuits.

10 Claims, 2 Drawing Sheets

METHOD AND APPARATUS FOR CONTROLLING PEAK AMPLIFIER AND DOHERTY POWER AMPLIFIER

CROSS-REFERENCE TO RELATED APPLICATION

This application is the U.S. national phase of PCT Appln. No. PCT/CN2011/081392 filed Oct. 27, 2011 which claims priority to Chinese Application No. 201110110315.8 filed Apr. 29, 2011, the disclosures of which are incorporated in their entirety by reference herein.

TECHNICAL FIELD

The present invention relates to the technical field of a power amplifier at a base station, and in particular, to a method, apparatus for controlling a peak amplifier and a Doherty power amplifier.

BACKGROUND OF THE RELATED ART

With greens environmental protection and low-carbon economy concepts becomes deeply rooted among the people continuously around the world, requirements of operators for reduction of power consumption of a wireless communication system also become increasing high. In the wireless communication system, a Radio Frequency (RF) power amplifier (power amplifier for short) in a base station device is one of core modules of the whole system, and an important index of the RF power amplifier is the efficiency of the power amplifier. It is indicated from data analysis that in the whole base station device, the energy consumption of the power amplifier portion accounts for about 60% of the overall energy consumption, and therefore, enhancing the efficiency of the power amplifier becomes most efficient means to reduce the power consumption of the base station device and reduce the operator's Operating Expense (OPEX). Therefore, in the face of the increasingly intensive market competition for wireless communications, high efficient RF power amplifier technologies have become one of focuses of competition in the wireless communication industry.

A Doherty power amplifier is a high efficient power amplifier technology which is the most widely applied currently in the wireless communication system, and was invented by a U.S. Electronics Engineer named William H. Doherty in 1936. However, in the next about thirty years, people diverted their attention. Until the late 1960s, with the development of the communications technology, especially of the satellite communications, the problem of the efficiency and linearity of the power amplifier was re-submitted in a new historical occasion, and the Doherty amplifier was excavated again and was widely used in communication and broadcasting systems in the 1970s. At present, the Doherty power amplifier is applied with the Digital Pre-Distortion (DPD) technology, and has become a mainstream architecture form of a high efficient power amplifier of a base station in a wireless communication system.

The basic idea of the Doherty power amplifier is an active load-pull, and the principle of a conventional Doherty power amplifier is shown in FIG. 1, a conventional Doherty power amplifier primarily comprises a drive stage amplifier (Dr1 . . . Drn in the figure), a power splitter (D in the figure), a carrier amplifier (C in the figure, which is also referred to as a main power amplifier), a peak amplifier (P in the figure, which is also referred to as an auxiliary power amplifier), a power combination circuit (Combiner in the figure), etc. Wherein, the carrier power amplifier operates in class B or AB, and the peak power amplifier operates in class C. Both bear different input signal powers respectively, and need to make their power amplifiers operate in respective saturation areas as much as possible, thus ensuring that the whole power amplifier maintains a high efficiency in a large range of the input signal power as much as possible, and meanwhile ensuring a certain linearity.

The Doherty power amplifier primarily comprises the following three operating states:

small signal area. When the input signal is small, the peak amplifier is in an off state, and the carrier amplifier operates in class AB, and at this time, the carrier amplifier operates in a matching state with a maximum efficiency;

load modulation area. When the input signal increases to a certain extent, the carrier amplifier gradually transitions from an amplification area to a saturation area, and the peak amplifier gradually transitions from a cut-off area to the amplification area, and at this time, the load of the carrier amplifier and the peak amplifier are both unstable, and the load impendence changes with the power; and saturation area. With the continuous increase of the input signal, both the carrier amplifier and the peak amplifier finally operate in the saturation state, and both correspond to a 50Ω load, and the output powers are added.

SUMMARY OF THE INVENTION

The requirements of operators for the communication system is that the lower the power consumption, the better, and the higher the efficiency, the better. Therefore, we must constantly seek a method to further reduce power consumption and enhance efficiency. While the traditional Doherty power amplifier has a disadvantage, that is, in theory, the power consumption of the peak power amplifier of the Doherty power amplifier is very small; however, in the actual power amplifier, the power consumption of the peak power amplifier accounts for 10%-20%. This is because that in the Doherty power amplifier the peak power amplifier operates in class C and the peak amplifier will not turned on when it operates at a small signal, and that when the amplification signal gradually becomes large to a certain extent from small, the carrier amplifier starts to have a compression trend, and at this time, the peak amplifier must be able to operate normally in an on state; otherwise, the improvements on the DPD and the linearity of the power amplifier will be influenced. While a class C amplifier is turned on gradually with a signal from small to large, and therefore, in the actual application, in order to enable the peak amplifier to be turned on completely when the carrier amplifier starts to compress, the peak amplifier must be turned on ahead of time at a lower level, thus increasing the power consumption of the peak power amplifier, and reducing the efficiency of the whole power amplifier.

The technical problem to be solved by the present invention is to provide a method, apparatus for controlling a peak amplifier and a Doherty power amplifier, which avoids increasing the peak power consumption when the peak amplifier is turned on ahead of time.

In order to solve the above technical problem, the present invention provides a method for controlling turn-on of a peak amplifier, which is applied to a Doherty power amplifier, comprising:

setting a RF switching circuit in a peak amplification branch of the Doherty power amplifier, and controlling turn-on and turn-off of the peak amplifier in the peak amplification branch through the RF switching circuit.

Alternatively, controlling turn-on and turn-off of the peak amplifier in the peak amplification branch through the RF switching circuit specifically comprises:

when an input signal of the peak amplification branch is less than a on-level of the RF switching circuit, the RF switching circuit being closed, and the peak amplifier being turned off; and when the input signal of the peak amplification branch is increased to the on-level of the RF switching circuit, the RF switching circuit being turned on, and the peak amplifier being turned on.

Alternatively, the method further comprises:

adjusting the on-level of the RF switching circuit by changing the value of a control voltage of the RF switching circuit.

Alternatively, when the peak amplification branch comprises multiple stage peak amplifiers, the RF switching circuit is set before a last stage peak amplifier.

Alternatively, the RF switching circuit comprises a PIN diode RF switch, or a RF switch of a Monolithic Microwave Integrated Circuit (MMIC).

The present invention further provides an apparatus for controlling a peak amplifier, comprising a RF switching circuit which is set in a peak amplification branch of a Doherty power amplifier; wherein, the RF switching circuit is configured to control turn-on and turn-off of a peak amplifier in the peak amplification branch.

Alternatively, the RF switching circuit is configured to control the turn-on and turn-off of the peak amplifier in the peak amplification branch according to the following modes:

when an input signal of the peak amplification branch is less than a on-level of the RF switching circuit, the RF switching circuit being closed, and the peak amplifier being turned off; and when an input signal of the peak amplification branch is increased to a on-level of the RF switching circuit, the RF switching circuit being turned on, and the peak amplifier being turned on.

Alternatively, the RF switching circuit is connected with a voltage control port, and the on-level of the RF switching circuit is adjusted through the value of a control voltage of the voltage control port.

Alternatively, when the peak amplification branch comprises multiple stage peak amplifiers, the RF switching circuit is set before a last stage peak amplifier.

In addition, the present invention further provides a Doherty power amplifier, comprising the apparatus for controlling the peak amplifier as described above.

Compared to the related art, the above technical scheme at least has the following advantages:

A. high efficiency, which avoids the disadvantage of the peak branch in the Doherty power amplifier being turned on ahead of time, and can reduce a proportion value of 10%-20% who is the proportion value of power consumption of a general peak power amplifier accounts for the overall power consumption of the power amplifier to 5%-10%, thus reducing the power consumption of the peak power amplifier and enhancing the mass efficiency of the whole power amplifier;

B. low expense, which largely reduces the product expense and production expense of the power amplifier compared to the scheme of some manufacturers improving on-time of the peak power amplifier using complex digital circuits; and C. small volume, which accounts for a much smaller volume compared to the scheme of some manufacturers improving on-time of the peak power amplifier using complex digital circuits.

BRIEF DESCRIPTION OF DRAWINGS

The accompanying drawings illustrated here are used to provide further understanding of the present invention, and constitute a part of the present application. The schematic examples of the present invention and illustration thereof are used to explain the present invention, instead of constituting improper limitation of the present invention. In the accompanying drawings.

PREFERRED EMBODIMENTS OF THE PRESENT INVENTION

The embodiments of the present invention reduce the power consumption of peak amplification by controlling turn-on and turn-off of a signal of a peak amplification branch of a Doherty power amplifier, thus enhancing the efficiency of the whole power amplifier.

Based on the above idea, the embodiments of the present invention use the following technical scheme: a RF switching circuit being added in the peak amplification branch of the Doherty power amplifier, and a RF switch being turned on when an input signal of the peak amplification branch is increased to a suitable amplitude, which results in the peak amplifier being turned on, it avoids the peak amplifier from being turned on ahead of time, thus reducing the power consumption of the peak power amplifier and enhancing the efficiency of the whole power amplifier.

The examples of the present invention will be described in detail in conjunction with accompanying drawings hereinafter. It should be illustrated that in the condition without conflict, the examples and features in the examples in the present application can be randomly combined with each other.

Figure 1:
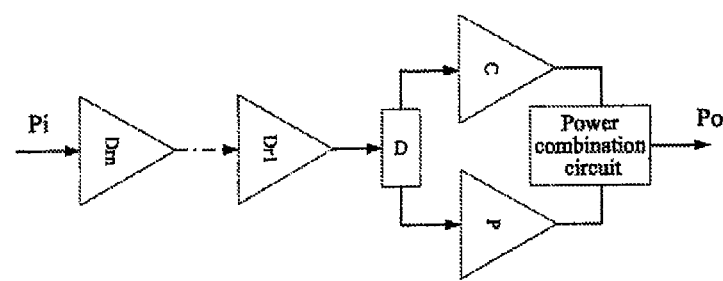
FIG. 1 is a schematic block diagram of a traditional Doherty power amplifier.
Figure 2:
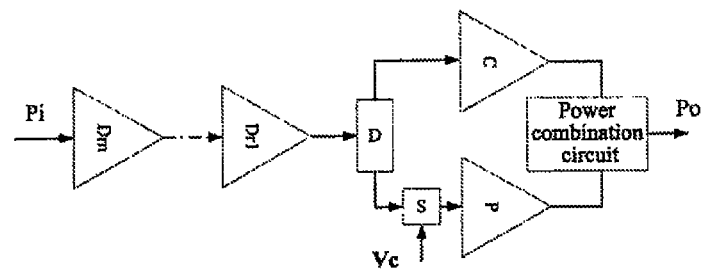
FIG. 2 is a principle block diagram of an embodiment of the present invention being applied to dual-path Doherty architecture.

FIG. 2 illustrates a block diagram of the technical scheme of the present invention being applied to dual-path Doherty architecture. In the figure, Pi is an input signal port; Dr1 . . . Drn are drive stage amplifiers; C is a carrier amplifier; P is a peak amplifier; S is a RF switching circuit; Vc is a control voltage of a RF switch (the change of the Vc can adjust a on-level of the RF switch), D is a power splitter circuit, Combiner is a power combination circuit, and Po is a signal output port. As shown in FIG. 2, the RF switching circuit S is located before last stage peak amplifiers (P11 . . . Pn1) of various peak amplification branches.

In conjunction with FIG. 2, the process of controlling the peak amplifier by the RF switching circuit according to an embodiment of the present invention is described as follows.

When the input signal of the peak amplification branch is small (lower than the on-level of the RF switch), the whole peak amplification branch is in an off state, and at this time, the whole carrier amplification branch operates in a AB class state matching with maximum efficiency.

When the input signal of the peak amplification branch increases to a certain extent, the carrier amplification branch starts to transitions from an amplification area to a saturation area, the peak amplification branch transitions from a cut-off area to the amplification area, and the peak power amplifier is not turned on at first, and thus does not have power consumption. When the signal input into the peak branch reaches the on-level of the RF switch, the RF switch is turned on, and the peak power amplifier is completely turned on therewith. Thus, the peak power amplifier is avoided from being turned on ahead of time, power consumption is reduced and the efficiency of the power amplifier is enhanced.

In addition, the change of the Vc can adjust the on-level of the RF switch, thus satisfying the requirements of different types of signals and different peak power amplifier devices.

At last, with the continuous increase of the input signal, both the whole carrier amplification branch and the peak amplification branch operate in a saturation state finally.

Figure 3:
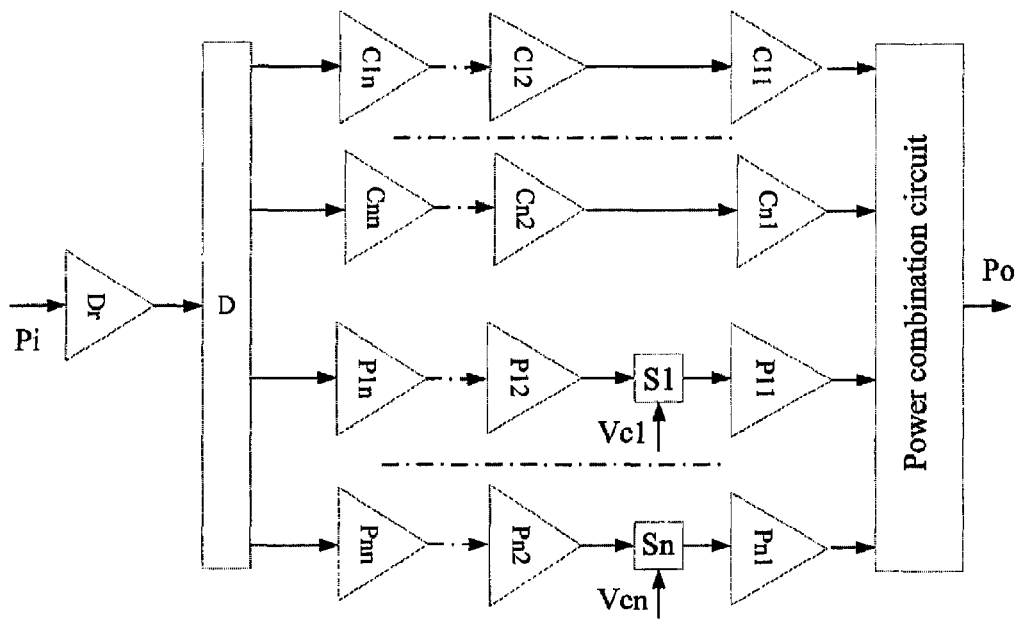
FIG. 3 is a principle block diagram of an embodiment of the present invention being applied to multi-stage multi-path Doherty architecture.
Figure 4:
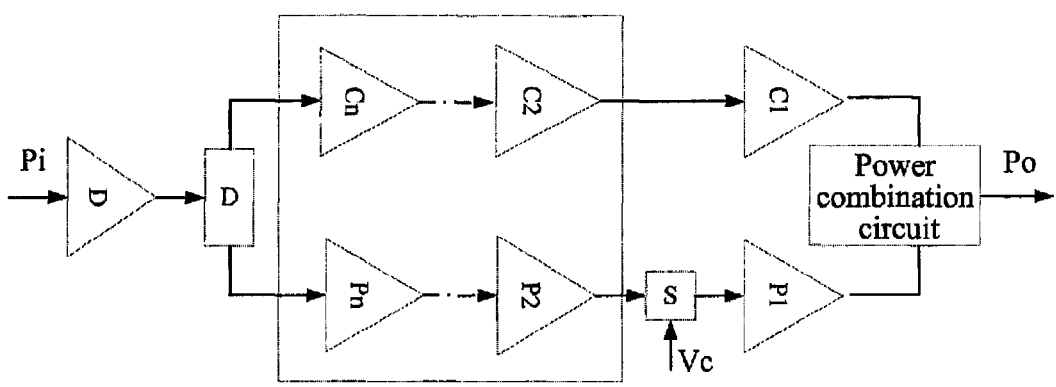
FIG. 4 is a schematic block diagram of application examples of the present invention being applied to a UMTS 2.1 GHz band 85 W power amplifier.

A diagram of the technical scheme of the present invention being applied to multi-path multi-stage Doherty power amplifier architecture is shown in FIG. 3. In the figure, Pi is an input signal port; Dr is a drive stage amplifier; D is a power splitter; C11 ... C1$n$ to Cn1 ... Cnn constitute 1st to nth carrier amplification branches of the multi-stage Doherty power amplifier; P11 ... P1$n$ to Pn1 ... Pnn constitute 1st to nth peak amplification branches of the multi-stage Doherty power amplifier; S1 ... Sn are RF switching circuits of 1st to nth peak amplification branches, and Vc1 ... Vcn are control voltages of corresponding RF switches (the changes of the values of the Vc1 ... Vcn can adjust the on-levels of the corresponding RF switches); and C is a power combination circuit. The principle of its performance improvement is similar to that of the dual-path Doherty power amplifier architecture.

In addition, the example of the present invention further provides a method for implementing controlling turn-on and turn-off of a peak amplifier by a RF switch and a method for designing Doherty. For example, the primary technical requirements of a certain UMTS power amplifier are as follows: a frequency range being 2110 MHz-2170 MHz, an output power being 85 W, an input signal being PAR7 dB, a gain being 50 dB, efficiency being 42%, and linearity indexes (including ACPR, SEM, Out of Band Spurious, etc.) satisfying requirements of a standard protocol.

In the present example, the process of completing the design of the whole Doherty power amplifier primarily comprises the following steps:

in step 1, a form of power amplifier architecture is determined. Since the output power of the present power amplifier is 85 W and the requirement of the efficiency is more than 42%, in consideration of the requirements of the technical indexes of the power amplifier and the condition of the existing devices comprehensively, the whole power amplifier is determined to use a form of the 2-dual Doherty architecture (as architecture shown in FIG. 2);

in step 2, when the peak amplifier comprises multiple stages, it is needed to select power amplifier devices for last stage carrier amplification (C1) and last stage peak amplification (P1) first. According to the PAR requirements on the output power and the input signal, the LDMOS power amplifier device BLF7G20LS-200 of the NXP company is selected as last stage carrier and peak amplifier devices;

in step 3, a drive stage device is selected. In the present example, the MD7IC2250 of the Freescale accompany is sleeted as a device for driving an Integrated Circuit (IC). The inner of the IC can comprise two amplification circuits, each of which comprises two stages. In addition, the SXA-389Z is selected as a first stage drive amplification device;

in step 4, the RF switching circuit of the peak amplification branch is completed. The implementation of the circuit comprises a variety of forms such as a PIN diode RF switch, a Monolithic Microwave Integrated Circuit (MMIC) RF switch etc., and the switching circuit must be able to be turned on quickly according to the requirements;

in step 5, designs of other circuits such as temperature compensator, circulators, couplers etc. are completed, and the principle diagram of the whole power amplifier and the PCB design are finally completed;

in step 6, the debug and test of the whole power amplifier are completed. The UMTS 201 GHz band 85 W power amplifier which is designed and completed according to the embodiments of the present invention is not only easy to implement, convenient and flexible to design and debug, low in cost and good in technical indexes, but also good in productivity.

The above description is merely preferred examples of specific implementation modes of the present invention, and can be widely applied to the design of various Doherty power amplifiers.

The above description is only the preferred embodiments of the present invention and is not intended to limit the protection scope of the present invention. The invention can have a variety of other embodiments, and for those skilled in the art, various corresponding changes and variations can be made according to the present invention without departing from the spirit and substance of the present invention, and all these corresponding changes and variations should belong to the protection scope of the appended claims of the present invention.

Obviously, those skilled in the art should understand that the above various modules or various steps of the present invention can be implemented by a general purpose computing apparatus, can be integrated on a single computing apparatus, or distributed across a network comprises a plurality of computing apparatuses; alternatively, the various modules and steps can be implemented by program codes executable by computer apparatuses, and thus can be stored in a storage apparatus to be executed by the computer apparatuses, and in some cases, the illustrated or described steps can be implemented in a different order from here, or can be implemented by being made into various IC modules respectively or by making multiple modules or steps therein into a single IC module. Thus, the present invention is not limited to any particular combination of hardware and software.

Industrial Applicability

The above embodiments at least have the following advantages:

A. high efficiency, which avoids the disadvantage of the peak branch in the Doherty power amplifier being turned on ahead of time, reduces the power consumption of the peak power amplifier, enhances the mass efficiency of the whole power amplifier, and can reduce the proportion value of 10%-20% who is the proportion value power consumption of a general peak power amplifier accounts for the overall power consumption of the power amplifier to 5%-10% after using the present invention;

B. low expense. The present invention largely reduces the product expense and production expense of the power amplifier compared to the scheme of some manufacturers improving on-time of the peak power amplifier using complex digital circuits; and C. small volume. The present invention accounts for a much smaller volume compared to the scheme of some manufacturers improving on-time of the peak power amplifier using complex digital circuits.

What is claimed is:

1. A method for controlling a peak amplifier, which is applied to a Doherty power amplifier, comprising:
   setting a Radio Frequency (RF) switching circuit in a peak amplification branch of the Doherty power amplifier, and controlling turn-on and turn-off of the peak amplifier in the peak amplification branch through the RF switching circuit;
   wherein, the peak amplification branch is composed of multiple stage peak amplifiers, the RF switching circuit is set before a last stage peak amplifier.

2. The method according to claim 1, wherein,
   the step of controlling turn-on and turn-off of the peak amplifier in the peak amplification branch through the RF switching circuit comprises:
   when an input signal of the peak amplification branch is less than on-level of the RF switching circuit, the RF switching circuit being turned off, and the peak amplifier being turned off; and
   when the input signal of the peak amplification branch is increased to the on-level of the RF switching circuit, the RF switching circuit being turned on, and the peak amplifier being turned on.

3. The method according to claim 1, further comprising:
   adjusting on-level of the RF switching circuit by changing a value of a control voltage of the RF switching circuit.

4. The method according to claim 1, wherein,
   the RF switching circuit comprises a PIN diode RF switch, or a RF switch of Monolithic Microwave Integrated Circuit (MMIC).

5. The method according to claim 2, wherein,
   the RF switching circuit comprises a PIN diode RF switch, or a RF switch of Monolithic Microwave Integrated Circuit (MMIC).

6. The method according to claim 3, wherein,
   the RF switching circuit comprises a PIN diode RF switch, or a RF switch of Monolithic Microwave Integrated Circuit (MMIC).

7. An apparatus for controlling a peak amplifier, comprising a Radio Frequency (RF) switching circuit which is set in a peak amplification branch of a Doherty power amplifier; wherein,
   the RF switching circuit is configured to control turn-on and turn-off of a peak amplifier in the peak amplification branch;
   wherein, the peak amplification branch is composed of r multiple stage peak amplifiers, the RF switching circuit is set before a last stage peak amplifier.

8. The apparatus according to claim 7, wherein,
   the RF switching circuit is configured to control the turn-on and turn-off of the peak amplifier in the peak amplification branch according to following modes:
   when an input signal of the peak amplification branch is less than on-level of the RF switching circuit, the RF switching circuit being turned off, and the peak amplifier being turned off; and
   when an input signal of the peak amplification branch is increased to the on-level of the RF switching circuit, the RF switching circuit being turned on, and the peak amplifier being turned on.

9. The apparatus according to claim 7, wherein,
   the RF switching circuit is connected with a voltage control port, and on-level of the RF switching circuit is adjusted through a value of a control voltage of the voltage control port.

10. A Doherty power amplifier, comprising the apparatus for controlling the peak amplifier according to claim 7.

* * * * *

UNITED STATES PATENT AND TRADEMARK OFFICE
CERTIFICATE OF CORRECTION

PATENT NO.       : 8,710,923 B2
APPLICATION NO.  : 13/513272
DATED            : April 29, 2014
INVENTOR(S)      : Huazhang Chen et al.

Page 1 of 1

It is certified that error appears in the above-identified patent and that said Letters Patent is hereby corrected as shown below:

In the Claims

Column 8, Line 12, Claim 7:

After "is composed of"
Delete "r".

Signed and Sealed this
First Day of July, 2014

Michelle K. Lee
*Deputy Director of the United States Patent and Trademark Office*